(12) United States Patent
Chambers (10) Patent No.: US 7,508,329 B1
(45) Date of Patent: Mar. 24, 2009

(54) LASER CONTROLLER INTEGRATED CIRCUIT INCLUDING VARIABLE RESOLUTION DATA PROCESSING DEVICE

(75) Inventor: Peter Chambers, Phoenix, AZ (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 11/968,912

(22) Filed: Jan. 3, 2008

(51) Int. Cl.
*H03M 7/00* (2006.01)

(52) U.S. Cl. ........................ 341/106; 341/155

(58) Field of Classification Search ........... 341/155, 341/106, 138; 702/130, 198, 85; 340/870.21
See application file for complete search history.

(56) References Cited

U.S. PATENT DOCUMENTS

| | | | |
|---|---|---|---|
| 4,282,578 A | 8/1981 | Payne et al. | |
| 4,482,974 A | 11/1984 | Kovalick | |
| 5,121,051 A * | 6/1992 | Steinbrecher et al. | ....... 324/111 |
| 5,365,465 A | 11/1994 | Larson | |
| 5,371,694 A | 12/1994 | Kawawaki et al. | |
| 5,379,239 A | 1/1995 | Nakatani | |
| 5,448,509 A | 9/1995 | Lee et al. | |
| 5,504,697 A | 4/1996 | Ishida | |
| 5,539,682 A | 7/1996 | Jain et al. | |
| 5,844,512 A | 12/1998 | Gorin et al. | |
| 5,942,992 A | 8/1999 | Kelly | |
| 6,043,804 A | 3/2000 | Greene | |
| 6,188,971 B1 * | 2/2001 | Kelly | ......................... 702/130 |
| 6,587,070 B2 | 7/2003 | Hallse | |
| 6,587,863 B1 | 7/2003 | Gentile et al. | |
| 7,395,287 B2 * | 7/2008 | Chambers et al. | ........... 708/206 |
| 2002/0161949 A1 | 10/2002 | Rzyski | |
| 2005/0131972 A1 | 6/2005 | Chambers et al. | |
| 2005/0131973 A1 | 6/2005 | Chambers et al. | |

* cited by examiner

*Primary Examiner*—Brian Young
(74) *Attorney, Agent, or Firm*—Patent Law Group LLP; Carmen C. Cook (57) ABSTRACT

A device for processing a digital input value includes a first memory portion having stored thereon Q delimiter values where the Q delimiter values divide the range of the N-bit digital input value into Q+1 regions and at least a first region and a second region are of unequal sizes, a second memory portion has stored thereon a look-up table storing Q+1 sets of coefficients for performing numerical value conversion of the digital input value to a digital output value in a second, natural unit, and an arithmetic logic performing numerical value conversion using the N-bit digital input value and the selected coefficient pair. The N-bit digital input value is compared with the Q delimiter values to determine a respective one of the Q+1 regions in which the N-bit digital input value lies. The look-up table is indexed according to the respective region to provide the selected coefficient pair.

21 Claims, 6 Drawing Sheets

LASER CONTROLLER INTEGRATED CIRCUIT INCLUDING VARIABLE RESOLUTION DATA PROCESSING DEVICE

CROSS-REFERENCE TO RELATED APPLICATION

This application is related to copending and commonly assigned U.S. patent application Ser. No. 10/759,786, entitled "Numerical Value Conversion Using A Look-Up Table For. Coefficient. Storage," of. Peter. Chambers and Joseph James Judkins III.

This application is also related to copending and commonly assigned U.S. patent application Ser. No. 10/759,988, entitled "Numerical Value Conversion Using A Saturation Limited Arithmetic Logic Unit Supporting Variable Resolution Operands," of Peter Chambers and Joseph James Judkins III.

FIELD OF THE INVENTION

The invention relates to a device for processing digital values and performing numerical value conversion of the digital values from one unit system to another unit system, usually a natural unit, and, in particular, to a data processing device coupled to an analog-to-digital converter for performing non-linear numerical value conversion using a look-up table for storing coefficients.

DESCRIPTION OF THE RELATED ART

In many electronic systems, an analog-to-digital converter (ADC) is often used to digitize an analog data source into digital values. The analog data source can be a voltage, a current, temperature or other real-world parameters. The analog-to-digital converter generates digital values in the form of "digital bits" where the digital bits are often expressed in arbitrary units. That is, a digitized output value of "0100" from the ADC does not necessarily correspond to 4 volts or 4 Amps but rather the digitized output value is merely a measurement of the analog data source on an arbitrary scale. The arbitrary scale is often a function of the characteristics of the ADC itself.

It is desirable and often necessary to have the digital values generated by an ADC expressed as real-world parameters, such as voltage in volts, current in. Amperes, and temperature in degree. Celsius or. Fahrenheit. Thus, in operation, after the ADC digitizes the analog data source (temperature, voltage or current) into digital values in arbitrary units, post-conversion data processing is carried out to convert the digital bits in an arbitrary unit into an appropriate real-world unit (e.g., degree. Celsius, volts and ampere). The post-conversion data processing is referred to as numerical value conversion. For example, the ADC may digitize an input voltage value and provide values in whole numbers of millivolts as the final digital output. In general, an arithmetic logic unit (ALU), with built-in multiplication and addition functions, is attached to the ADC to perform the necessary numerical value conversion.

The numerical value conversion process uses one or more coefficients for transforming the digital values in arbitrary units into the desired real-world unit. Typically, the coefficients are stored in a memory or registers and are retrieved by the ALU to perform the conversion. Thus, in conventional systems, the coefficients are treated as constants to be applied for the conversion of all digitized values. However, in some applications, the values of the coefficients to be used may vary depending on certain parameters, such as the operating conditions of the device generating the analog data source or the ADC generating the digitized values.

Furthermore, in most applications, an analog-to-digital converter is used to digitize a single analog data source. However, in some applications, it is desirable to use a single analog-to-digital converter to digitize multiple analog data sources. In that case, there is a requirement to convert digital values from the ADC into various physical units, each conversion requiring separate set of coefficients. The numerical value conversion process must therefore support the use of multiple coefficients for realizing numerical value conversion into multiple units. Moreover, the conversion between the digital value in the arbitrary unit to the digital value in the desire real-world unit may involve a non-linear relationship. When the numerical value conversion has a non-linear relationship, the coefficients must be able to approximate the non-linear conversion relationship.

SUMMARY OF THE INVENTION

According to one embodiment of the present invention, a device for processing an N-bit digital input value generated by an analog-to-digital converter and generating a digital output signal is described. The digital input value is in a first unit being an arbitrary unit and the digital output signal is in a second unit being a natural unit of physical measurement and being related to the first unit by a first equation. The digital output signal is for use by a host processor to process information that is captured by the analog-to-digital converter. The device includes a memory including a first memory portion and a second memory portion. The first memory portion has stored thereon Q delimiter values where the Q delimiter values divide the range of the N-bit digital input value into Q+1 regions and at least a first region and a second region in the Q+1 regions are of unequal sizes. The second memory portion has stored thereon a look-up table storing Q+1 sets of coefficients for performing numerical value conversion of the digital input value in the first unit to the digital output value in the second unit. Each set of coefficients includes a coefficient pair of slope and offset coefficients and being associated with a respective one of the Q+1 regions of digital input values. The look-up table is indexed by a first indexing parameter to provide a selected coefficient pair of slope and offset coefficients where the first indexing parameter is selected to operate the device for non-linear conversion. An arithmetic logic unit receives the N-bit digital input value in the first unit and the selected coefficient pair of slope and offset coefficients from the look-up table in the second memory portion. The arithmetic logic unit performs numerical value conversion based on the first equation and computes the digital output value in the second unit using the N-bit digital input value and the selected coefficient pair.

In operation, the N-bit digital input value is compared with the Q delimiter values to determine a respective one of the Q+1 regions in which the N-bit digital input value lies and the first indexing parameter has a value indicative of the respective one of the Q+1 regions and being applied to the look-up table to provided the selected coefficient pair.

According to another aspect of the present invention, a method for processing an N-bit digital input value generated by an analog-to-digital converter and generating a digital output signal is described. The digital input value is in a first unit being an arbitrary unit and the digital output signal is in a second unit being a natural unit of physical measurement and being related to the first unit by a first equation and the digital output signal is for use by a host processor to process information captured by the analog-to-digital converter. The method includes storing Q delimiter values in a first memory portion of a memory where the Q delimiter values divides the range of the N-bit digital input value into Q+1 regions and at least a first region and a second region in the Q+1 regions are of unequal sizes, storing Q+1 sets of coefficients in a look-up table in a second memory portion of the memory for performing the numerical value conversion of the digital input value in the first unit to digital output value in the second unit where each set of coefficients includes a coefficient pair of slope and offset coefficients and being associated with a respective one of the Q+1 regions of digital input values, comparing the N-bit digital input value with the Q delimiter values to determine a respective one of the Q+1 regions in which the N-bit digital input value lies, generating a first indexing parameter having a value indicative of the respective one of the Q+1 regions, indexing the look-up table using the first indexing parameter to provide a selected coefficient pair of slope and offset coefficients where the first indexing parameter is selected to operate the device for non-linear conversion, providing the N-bit digital input value and the selected coefficient pair of slope and offset coefficients to an arithmetic logic unit, and performing numerical value conversion at the arithmetic logic unit based on the first equation and using the N-bit digital input value and the selected coefficient pair of slope and offset coefficients to compute a digital output value in the second unit from the digital input value in the first unit.

The present invention is better understood upon consideration of the detailed description below and the accompanying drawings.

DETAILED DESCRIPTION OF THE PREFERRED EMBODIMENTS

In accordance with the principles of the present invention, a data processing device uses variable range coefficients to perform post-conversion processing of an N-bit digital input value generated by an analog-to-digital converter. The variable range coefficients are used to perform numerical value conversion of the digital value in an arbitrary unit to a digital value in a natural unit where the natural unit and the arbitrary unit have a non-linear relationship. The variable range coefficients enable close approximation of the non-linear relationship for improving the accuracy of the conversion. More specifically, the range of digital input values is divided into unequal regions where each region is associated with a respective set of conversion coefficients. The size of the regions is selected to realize a close piecewise-linear approximation of the non-linear conversion relationship, such as a logarithmic relationship.

In one embodiment, the coefficients are stored in a look-up table indexed by an indexing parameter. By using a look-up table for coefficient storage, complex numerical value conversion can be performed with simple and minimum circuitry. The data processing device of the present invention can be applied to systems where device size and operation speed is critical. Moreover, complex numerical value conversions can be implemented with simplified circuitry.

The data processing device of the present invention has many applications and is particularly useful when coupled to an analog-to-digital converter (ADC) to provide post-conversion data processing for the ADC. In this manner, an ADC system including an ADC and a data processing device of the present invention provides digital output values that are expressed in real-world units. Host systems interfacing with the ADC system can readily utilize the digital output values without further processing.

Furthermore, the data processing device of the present invention can be applied to perform conversion of digital input values from any data source. Basically, the data processing device of the present invention can be used to convert digital input values expressed in a first unit system to digital output values expressed in a second unit system. The data processing device is particularly advantageous when the relationship between the first unit system and the second unit system is non-linear.

As mentioned above, an analog-to-digital converter typically generates digital values in an arbitrary unit and the digital values have to be converted into a real-world unit or a natural unit to be useful. In the present description, real-world units or natural units refer to units of physical measurement such as degree. Centigrade, volts, ampere, Decibels and watts. In the following description, the data processing device is described as being implemented in an analog-to-digital converter coupled to digitize one or more analog data source. However, the implementation of data processing device of the present invention in an analog-to-digital converter is illustrative only. In other embodiments, the data processing device of the present invention can be applied for performing numerical value conversion of other digital data source whether provided by an ADC or not. In the present description, the digital output values of an analog-to-digital converter is referred to as the ADC results or the digital bits and are the digital input values into the data processing device of the present invention.

Analog to digital converters generally produce results that are not comprehensible as natural units. For example, an ADC measuring voltage to a resolution of eight bits might have a full-scale value of 11111111 (255 decimal, FF hexadecimal). The full-scale value may correspond to a full-scale voltage of 1.25 volts. When the ADC digitizes a 1 volt signal, the digital result is an arbitrary binary number, such as 11001100 (204 decimal, CC hex). There is often a need to provide the ADC results in a more user-friendly format. For example, it is often desirable to display the ADC result for the 1-Volt signal as 1000 millivolts (1111101000 binary).

To convert digital values expressed in an arbitrary unit to a natural unit, a slope/offset conversion equation is often used. The relationship between the digital value and the natural unit value is expressed as:

$$D_N = m\, D_A + c,\qquad\text{Eq. (1)}$$

where $D_N$ is the desired digital output value in a natural unit, $D_A$ is the digital input value to be converted in an arbitrary unit, m is a slope coefficient, and c is an offset coefficient.

In the case of a digitized voltage value, the relationship between the digitized voltage value in an arbitrary ADC unit and the voltage value in a natural unit can be expressed as:

$$V_n = m\, V_{ADC} + c,\qquad\text{Eq. (2)}$$

where $V_n$ is the desired digital output voltage value in a natural unit (e.g. volts or millivolts), $V_{ADC}$ is the digitized voltage value to be converted in an arbitrary unit, m is a slope coefficient, and c is an offset coefficient. When applied to the example given above where an 8-bit full-scale range represents 1.25 volts, a slope coefficient m of 4.90196 and an offset coefficient c of 0 can be used to perform the numerical value conversion between the arbitrary ADC unit and the natural unit. Thus, the conversion equation is given as:

$$V_n = 4.90196\, V_{ADC}.$$

When $V_{ADC} = 204$, then $V_n = 1000$.

By performing the numerical value conversion, the ADC result can be meaningfully expressed as a value in millivolts. The computation of the numerical value conversion is typically performed by an arithmetic logic unit (ALU), which has built-in multiplication and addition functions. In conventional systems, the coefficients m and c are often treated as constants, provided from registers or memory. The aforementioned '786 patent application describes a device and method where a set of coefficients m and c are provided and stored in a look-up table such that the values of the coefficients used for the conversion can be selected based on other parameters. For example, the coefficients can be selected based on the operating conditions or parameters of the system providing the digital values. In this manner, a more accurate numerical value conversion can be realized.

The above equations describe a linear relationship between the digital input values and the converted values, in some applications, the relationship between the digital input values and the chosen set of natural units is non-linear. For example, an ADC might digitize a voltage signal, but a digital value in Decibels (dB) is desired. The relationship between voltage and Decibel is in a logarithmic scale, not linear. In this case, the non-linear relationship can be expressed as a polynomial with coefficients and exponents as follows:

$$V_n = m_1 V + m_2 V^2 + m_3 V^3 + m_4 V^4 + c,\qquad\text{Eq. (3)}$$

where $V_n$ is the desired output voltage value in Decibels, V is the digitized voltage value to be converted in an arbitrary unit, $m_1$ to $m_4$ are the polynomial coefficients and c is an offset coefficient. While it is possible to build an ALU to evaluate such a polynomial, the resulting ALU is usually very slow and large in size making such implementation undesirable. In applications where speed or device size is critical, direct calculation using an ALU is not practical.

In accordance with the principals of the present invention, a data processing device supports non-linear conversion by using variable range coefficients that closely approximate a piecewise-linear conversion. In this manner, highly accurate numerical conversion results can be obtained at high speed and with simplified circuitry.

The data processing device of the present invention can be incorporated in a variety of electronic devices and coupled to an analog-to-digital converter for performing precision numerical value conversion. In the following description, the data processing device of the present invention is described as being implemented in an optical transceiver controller. The application of the data processing device in an optical transceiver controller is illustrative only. One of ordinary skill in the art would appreciate that the data processing device of the present invention can be applied to other electronic devices for providing accurate numerical value conversion of digitized data values.

Figure 1:
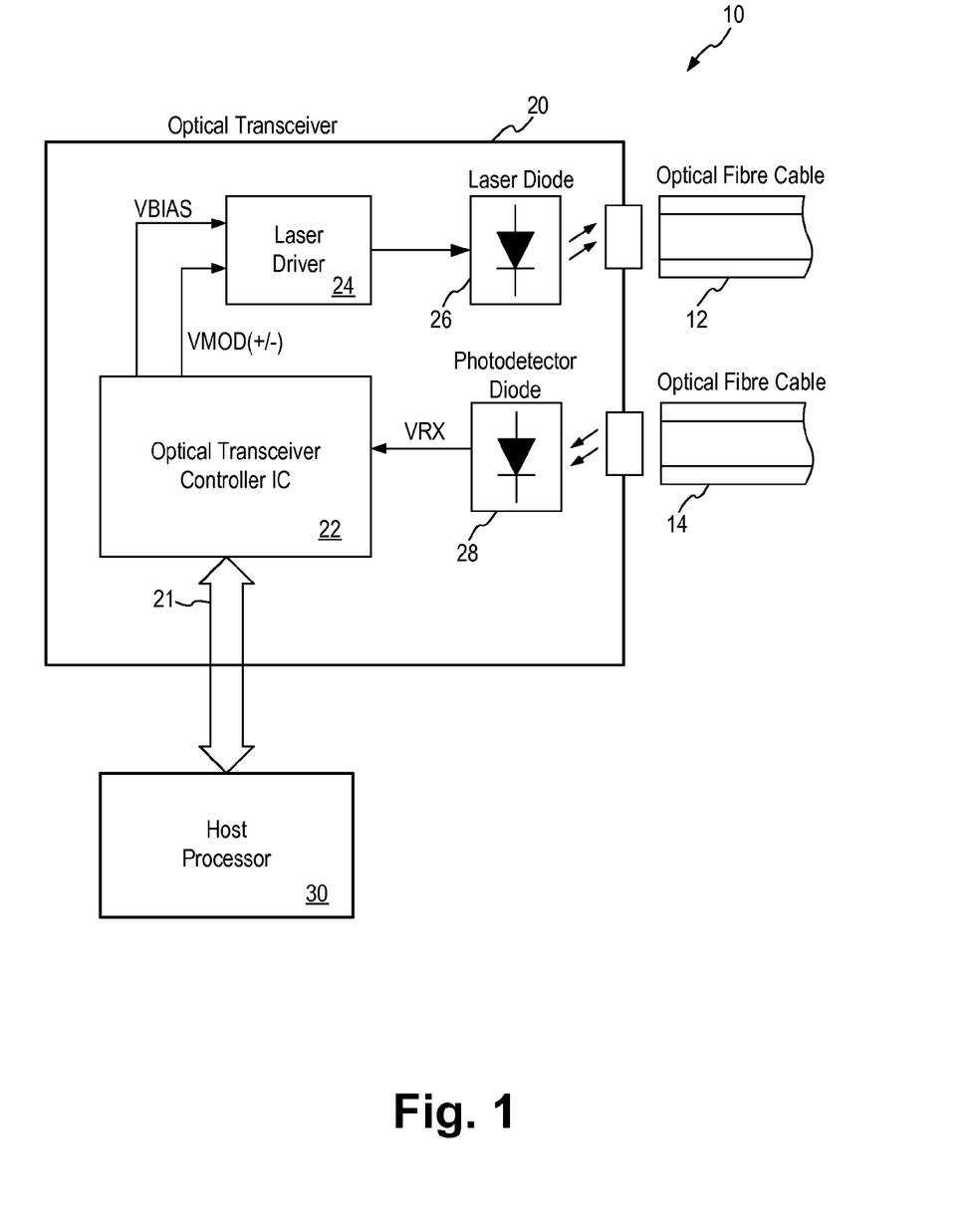
FIG. 1 is a schematic diagram of an optical transceiver in which the data processing device of the present invention is incorporated according to one embodiment of the present invention.

FIG. 1 is a schematic diagram of an optical transceiver in which the data processing device of the present invention is incorporated according to one embodiment of the present invention. Referring to FIG. 1, an optical transceiver 20 is used in an optical communication system 10 to transmit and receive optical signals on optical fibre cables 12 and 14. Optical transceiver 20 includes a laser diode 26 emitting light signals representing transmitted signals and a photodetector diode 28 detecting incoming light indicative of the received signals. Optical transceiver 20 includes an optical transceiver controller 22 for operating the laser diode for signal transmission and operating the photodetector diode for reception of the optical signals. Controller 22 is typically implemented as an integrated circuit and is therefore often referred to as an optical transceiver controller IC. In operation, controller 22 generates a bias signal VBIAS and a pair of modulation signals (VMOD+/−) for a laser driver 24. Laser driver 24 drives laser diode 26 based on the bias voltage value and the modulation signals. Controller 22 receives a received power signal VRX in the form of a voltage value from photodetector diode 26. The received power signal is indicative of the optical signal detected on optical fibre cable 14.

Optical transceiver controller 22 interfaces with a host processor 30 via a data bus 21. In this manner, optical transceiver controller 22 receives control and data signals from host processor 30 and host processor 30 receives data and status signals from controller 22. In many applications, the host processor 30 monitors the operational status of optical transceiver 20 and receives data signals from optical transceiver 20 indicative of the status or operating conditions of the optical transceiver. The operating conditions are usually digitized values of analog data sources, such as voltages, currents or temperature measurements. To ease the computational burden of the host processor 30, it is often desirable to provide these digitized values to the host processor in their natural units. If the digitized data are provided to the host processor directly in arbitrary units as generated by the ADC, the host processor would have to perform the post-conversion processing to natural units before the digitized data can be meaningfully interpreted.

In FIG. 1, a simplified block diagram of optical transceiver 20 is shown. In actual implementation, optical transceiver 20 may include other components to support the transmission and reception of optical signals on the optical fibre cables. The exact configuration of optical transceiver 20 is not critical to the practice of the present invention. The data processing device of the present invention is incorporated in the optical transceiver controller integrated circuit to provide numerical value conversion of digitized data collected by the controller.

Figure 2:
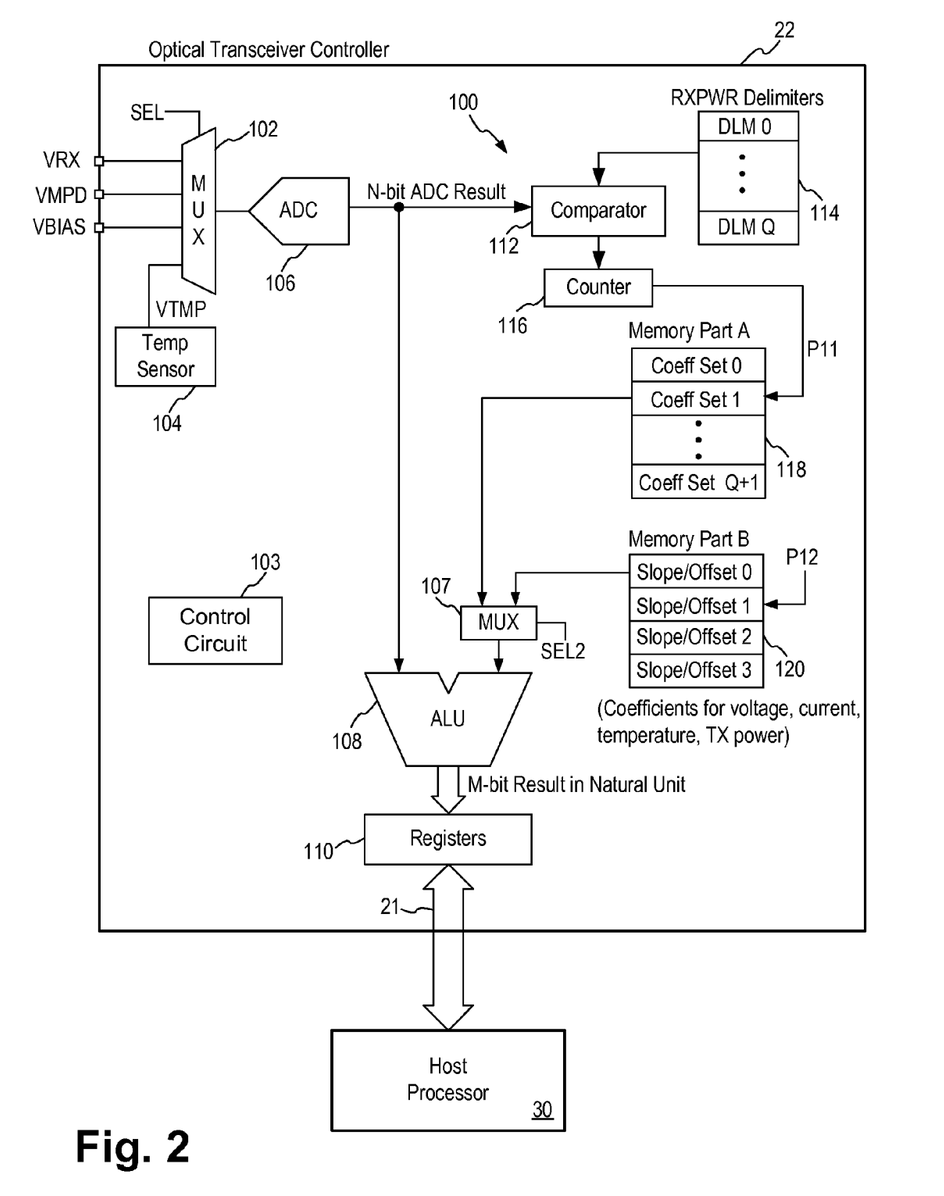
FIG. 2 is a schematic diagram of an optical transceiver controller in which the data processing device of the present invention is incorporated according to one embodiment of the present invention.

FIG. 2 is a schematic diagram of an optical transceiver controller in which the data processing device of the present invention is incorporated according to one embodiment of the present invention. The schematic diagram of FIG. 2 illustrates only the data processing device of the present invention and components of optical transceiver controller pertinent to the data processing device. In actual implementation, the optical transceiver controller will include other circuitry not shown in FIG. 2. The exact implementation of the optical transceiver controller is not critical to the practice of the present invention. It is only necessary that the optical transceiver controller includes an analog-to-digital converter generating digitized data that requires post-conversion processing.

Referring to FIG. 2, optical transceiver controller 22 (controller 22) receive various analog input data source indicative of the operating conditions of the optical transceiver system. In the present embodiment, controller 22 receives a first input voltage VRX indicative of the received power of the optical transceiver system. For instance, voltage VRX is generated by the photodetector diode detecting the optical power on optical fibre cable 14 (FIG. 1). Controller 22 also receives a second input voltage VMPD indicative of the voltage of a monitor diode of the optical transceiver system. In the optical transceiver system of FIG. 1, a monitor photodetector diode (not shown) is typically coupled to laser diode 26 to monitor the output power of the laser diode. Controller 22 receives the monitor voltage VMPD to monitor the operation status of laser diode 26. Lastly, controller 22 receives a third input voltage VBIAS indicative of the bias current supplied to laser diode 26. The bias current of the laser diode is monitored and adjusted to ensure proper lasing operation. In the present embodiment, controller 22 also includes a temperature sensor 104 for measuring the ambient temperature. Temperature sensor 104 generates a voltage VTMP indicative of the measured temperature.

Controller 22 includes a single analog-to-digital converter 106 for digitizing the multiple analog input voltages. To that end, the multiple input voltages VRX, VMPD, VBIAS and VTMP are coupled to a multiplexer 102 which selects one input channel to be digitized at a time by ADC 106. Multiplexor 102 is controlled by a select signal SEL which is generated by a control circuit 103 in optical transceiver controller 22. ADC 106 generates ADC results in N bits and the N-bit ADC results are subjected to post-conversion processing before being provided on bus 21 to host processor 30. In accordance with the present invention, a data processing device 100 is incorporated in controller 22 to provide post-conversion processing for ADC 106. As such, the ADC system formed by ADC 106 and data processing device 100 digitizes analog data sources and provides digital output values that are expressed in real-world or natural units.

Data processing device 100 in controller 22 includes an arithmetic logic unit (ALU 108) with built-in multiplication and addition functions. ALU 108 receives the N-bit ADC result from ADC 106 as the digital input value. ALU 108 also receives slope and offset coefficients from one or more look-up tables 118, 120. Look-up table 118 is indexed by an indexing parameter P11 to provide a selected pair of slope and offset coefficients to ALU 108. Look-up table 120 is indexed by an indexing parameter P12 to provide a selected pair of slope and offset coefficients to ALU 108. In the present embodiment, look-up tables 118 and 120 are implemented as one or more memory units, such as a random-access memory. In the present embodiment, look-up tables 118 and 120 are stored in different parts of a single memory unit. In other embodiments, each look-up table can be implemented in separate memory units.

In the present embodiment, data processing device 100 includes look-up table 118 for storing coefficients associated with the received power (RXPWR) parameter. That is, the coefficients in look-up table 118 are used for numerical value conversion of the input voltage VRX indicative of the received power RXPWR parameter. Furthermore, data processing device 100 includes lookup table 120 for storing coefficients associated with all other input values of controller 22, such as the monitor voltage VMPD, the bias current VBIAS and temperature.

Figure 3:
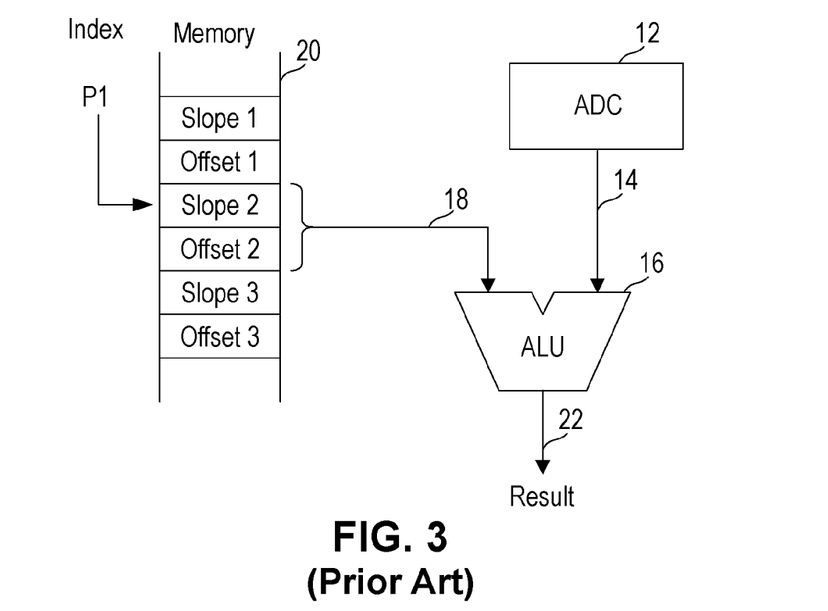
FIG. 3 duplicates FIG. 1 of U.S. patent application Ser. No. 10/759,786 and is a schematic diagram of a device for performing numerical value conversion using a look-up table for coefficient storage.

In the present embodiment, look-up table 120 is indexed in a manner as described in the '786 patent application to provide the appropriate coefficients for ALU 108, as shown in FIGS. 3-6. For instance, look-up table 120 can be indexed by the operating conditions of the optical transceiver in which the analog data source is generated or of the system in which the digital input values is generated, such as the ADC. For example, in one embodiment, the pairs of coefficients are a function of the operating temperature. As shown in FIG. 3, the indexing parameter P1 can be a temperature value for indexing the look-up table 20 to provide the selected set of slope and offset coefficients. By using a set of temperature-dependent coefficients, data processing device 100 enables the ADC system to temperature compensate the numerical value conversion.

Figure 4:
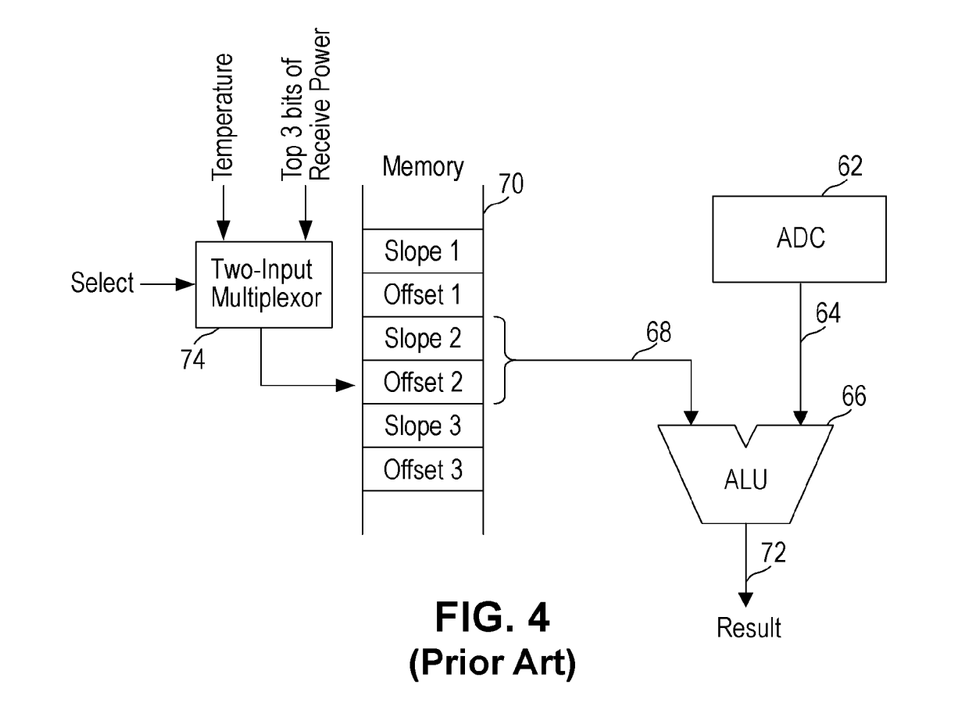
FIG. 4 duplicates FIG. 6 of U.S. patent application Ser. No. 10/759,786 and is a schematic diagram of a device for performing numerical value conversion using a look-up table for coefficient storage according to an alternate embodiment of the present invention.

Alternately, look-up table 120 can be indexed by multiple parameters, as shown in FIG. 4. Referring to FIG. 4, a multiplexor can be used to select one of several parameters to index the look-up table. In the embodiment shown in FIG. 4 which is duplicated from the '786 patent application, the look-up table is indexed by a temperature parameter and a. Received. Power parameter (top three bits). Multiplexor 74 is coupled to select one of the two indexing parameters based on a. Select signal. Thus, indexing parameter P12 for look-up table 120 (FIG. 2) can represent a selected one of multiple parameters. By incorporating a multiplexor to select between two or more indexing parameters, data processing device 100 of the present invention can be selectively operated for temperature compensation or for non-linear conversion or other desired compensation.

Figure 5:
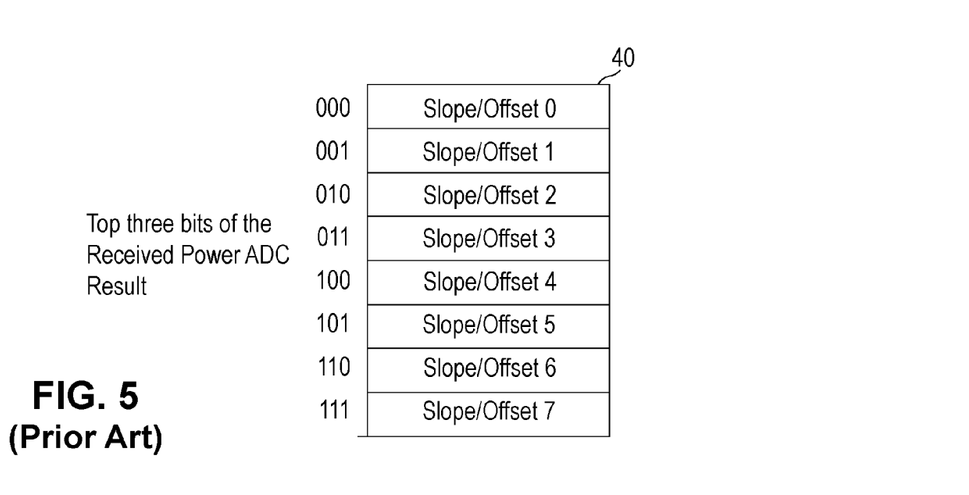
FIG. 5 duplicates FIG. 4 of U.S. patent application Ser. No. 10/759,786 and illustrates a look-up table that implements numerical value conversion using a piecewise-linear approach.

As described in the '786 patent application, the look-up tables can be configured to implement a piecewise-linear conversion that approximates a non-linear conversion relationship. FIG. 5, which duplicates FIG. 4 of the '786 patent application, illustrates a look-up table 40 that implements numerical value conversion using a piecewise-linear approach. Referring to FIG. 4, look-up table 40 includes entries for storing pairs of slope and offset coefficients. Look-up table 40 uses the top three bits (the most significant three bits) of the digital input values to be converted as the indexing parameter to the memory-based table of coefficient pairs. Using the top three bits of the digital input values as an indexing parameter effectively partitions the range of the digital input values into equal regions where each region employs a linear conversion of the digital input value to the desired converted output value. Each entry of the look-up table thus includes coefficients associated with a region of the digital input values. In this manner, a piecewise-linear conversion is implemented to approximate the non-linear relationship between the digital input value and the converted value.

Figure 6:
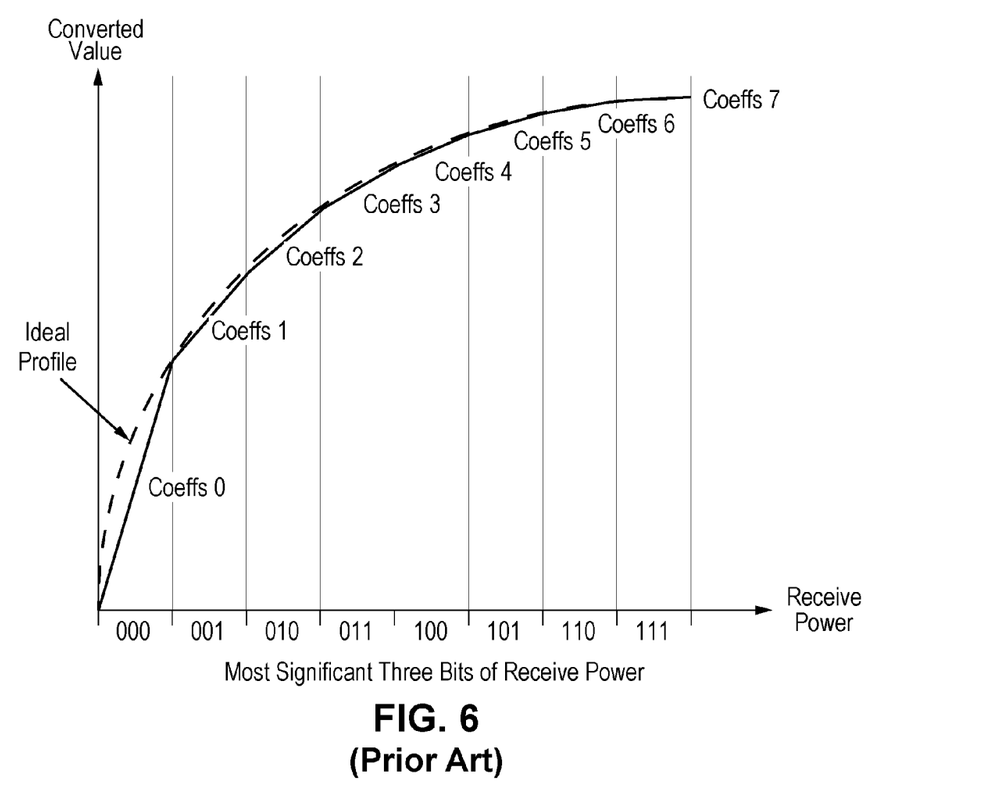
FIG. 6 duplicates FIG. 5 of U.S. patent application Ser. No. 10/759,786 and is a graph illustrating the effect of using the look-up table of FIG. 5 to implement a piecewise-linear approach for approximating a non-linear conversion relationship.

The effect of the piecewise-linear conversion of FIG. 5 is shown in FIG. 6. The dotted-line curve represents the ideal logarithmic conversion from the ADC results (a digitized voltage value) to a converted value in dB. The solid-line curve represents the piecewise-linear approximation of the conversion using look-up table 40 of FIG. 5. The use of the most significant three bits of the ADC result partitions the range of digital input values into eight equal regions, each region being assigned its own pair of slope and offset coefficients.

The piecewise-linear approach of FIG. 5 uses the most significant 3 bits of the ADC results as indexing parameter so that the range of input values is divided into 8 equal regions. While a good approximation to the ideal profile is realized for large ADC result values, a significant deviation from the ideal profile can result in regions where the slope of the ideal profile rises quickly, as in the regions with small ADC result values. Data processing device 100 of the present invention introduces a variable range coefficient method for piecewise-linear conversion which improves the accuracy of the approximation of the non-linear relationship between the digital input value and the converted value.

In accordance with one embodiment of the present invention, the variable range coefficient method of data processing device 100 is applied to the analog input voltage VRX indicative of the received power RXPWR parameter. As described above, the received power RXPWR parameter is a measurement of the amount of energy received by a photodiode at the end of an optical fiber. There is a non-linear relationship between the photodiode's output (measured as a voltage) and the desired output result, a value to be expressed in Decibels. To more accurately approximate the non-linear relationship between the voltage VRX and the converted result in natural unit (Decibels), the data processing device of the present invention employs variable range coefficients. Thus, in accordance with the present invention, look-up table 118 stores the variable range coefficients for the received power RXPWR parameter. The variable range coefficients and the method for indexing look-up table 118 will be described with reference to FIGS. 7 and 8.

Figure 8:
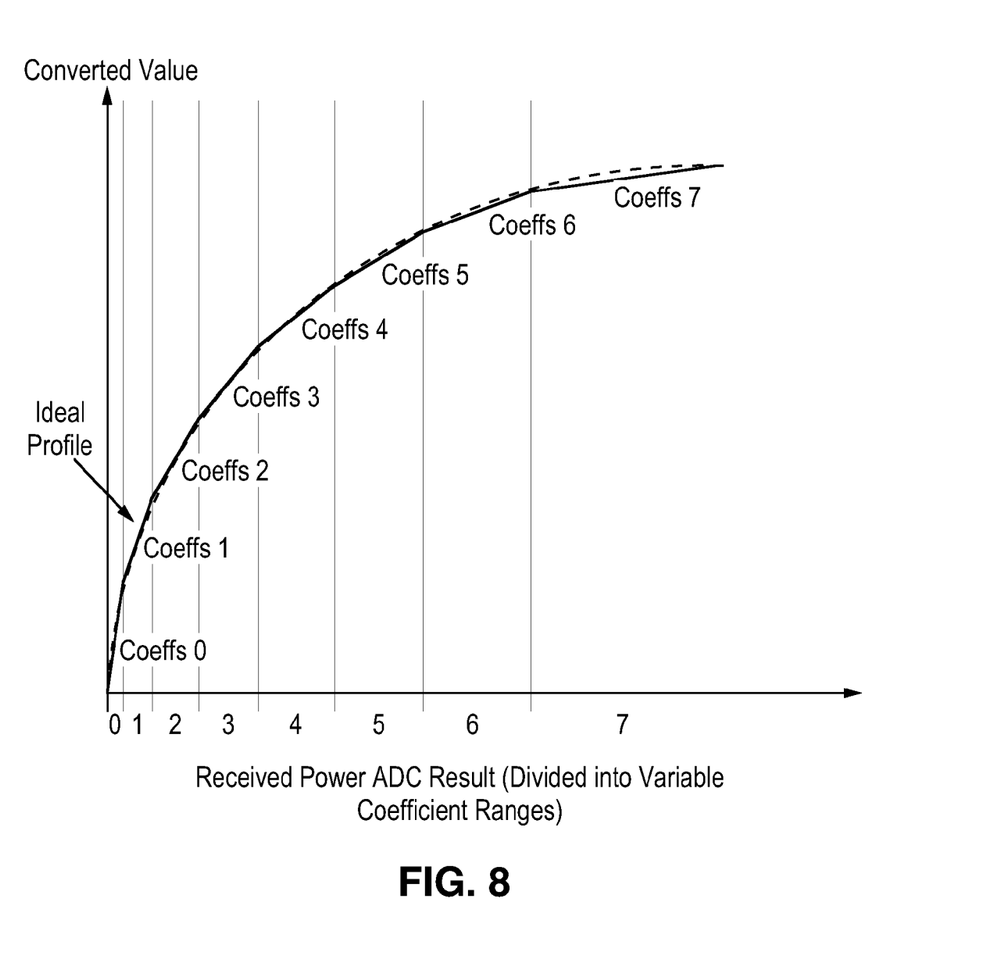
FIG. 8 is a graph illustrating the effect of using the variable range look-up table of FIG. 7 to implement a piecewise-linear approach for approximating a non-linear conversion relationship.

Referring first to FIG. 8, in the present embodiment, the range of the received power ADC results is partitioned into eight unequal regions. Smaller regions are used when the non-linear relationship has a large slope and wider regions are used when the non-linear relationship has a small slope. Each of the regions is provided with a set of slope and offset coefficients to realize a linear conversion within that region. By using smaller regions for steeply sloped portion of the ideal profile and using larger regions for more moderately sloped portion of the ideal profile, the piecewise-linear approximation realized by coefficients sets. Coeffs 0 to. Coeffs 7 can closely follow the ideal profile, as shown in FIG. 8. As a result, a more accurate converted value is obtained for all value of the ADC results using the eight sets of variable range coefficients as compared to coefficients for fixed regions. In the present embodiment, look-up table 118 stores the eight sets of coefficients as. Coeff set 0 to. Coeff set 7.

The method for selecting a set of coefficients from look-up table 118 is now described with reference to FIG. 7. In data processing device 100 of the present invention, the range of the ADC results is partitioned or divided by Q delimiter values into Q+1 regions where at least two of the regions are of unequal sizes. In the case of 7 delimiter values (Delimiter 0 to. Delimiter 6), 8 regions of ADC values result (regions 0 to 7). Delimiter 0 to. Delimiter 6 are assumed to have monotonically increasing values. Accordingly, each of the Q+1 regions is bounded by an upper delimiter and a lower delimiter, except for the first and last regions which are bounded by an upper or an lower delimiter only, respectively. Each of the Q+1 regions defined by the delimiter values is associated with a set of coefficients:. Coeff. Set 0 to. Coeff. Set 7. To select a set of coefficients from look-up table 118, the digital input value which is the N-bit ADC result is compared with the delimiter values to determine in which Q+1 region the digital input value lies.

Figure 7:
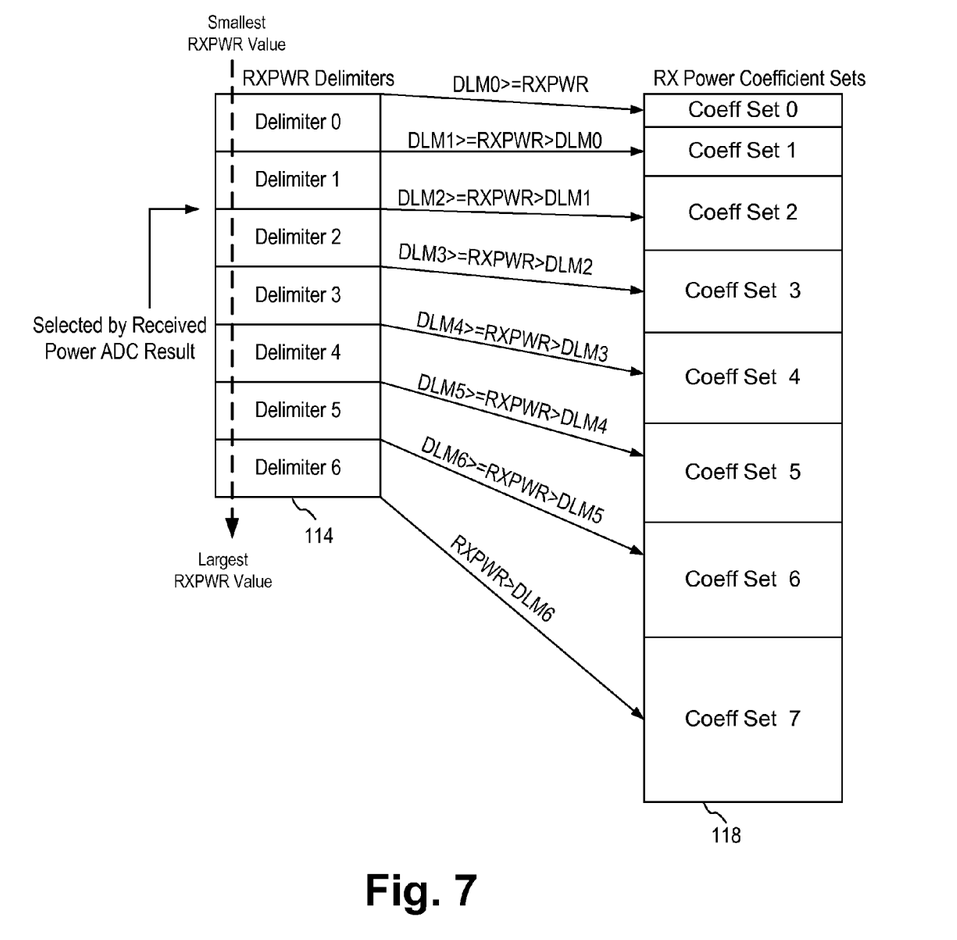
FIG. 7 illustrates the mapping of the delimiter values for the received power parameter to the received power coefficient sets according to one embodiment of the present invention.

Referring to FIG. 7, the N-bit received power ADC result is referred herein as the RXPWR value. In the present embodiment, the RXPWR value is compared against the delimiters values where an in-region hit is defined as:

Lower Delimiter<RXPWR <=Upper Delimiter.

For instance, when the RXPWR value is less than or equal to the second delimiter value—Delimiter 1—but greater than the first delimiter value—Delimiter 0, the RXPWR value falls into the second region (region 1) and the second coefficient set. Coeff. Set 1 is selected. The same applies to coefficient sets. Coeff. Set 2-6. At the boundaries, when the RXPWR value is less than or equal to the first delimiter value—Delimiter 0, the RXPWR value falls into the first region (region 0) and the first coefficient set. Coeff. Set 0 is selected. When the RXPWR value is greater than the last delimiter value—Delimiter 6, the RXPWR value falls into the last region (region 7) and the last coefficient set. Coeff. Set 7 is selected. In this manner, the received power ADC result RXPWR is used to determine which coefficient set to use for the numerical value conversion.

In the present embodiment, the delimiter values partitioning the range of ADC results are user programmable so that the desired size of each region can be defined to allow close approximation to the ideal profile. Fine and coarse regions can be defined so that the piecewise-linear approximation follows the non-linear relationship closely.

FIG. 2 illustrates one method of implementing the variable range coefficients in data processing device 100 of controller 22. Returning to FIG. 2, the delimiter values for the received power RXPWR parameter are stored in a memory unit 114, such as a set of registers. Memory unit 114 can be part of the same memory storing look-up table 118 and look-up table 120 or it can be formed by a separate memory unit. Data processing device 100 includes a comparator 112 receiving the N-bit ADC result from ADC 106 and also receiving the received power delimiter values from memory unit 114. When the ADC result is the RXPWR parameter, comparator 112 compares the N-bit ADC result with each of the RXPWR delimiter values in turn. In the present embodiment, the RXPWR delimiter values are provided to comparator 112 in order from the smallest value to the largest value. Each time a delimiter value is provided to comparator 112, a counter 116 increments its count once.

In the present embodiment, when the RXPWR value is smaller than or equal to the delimiter value, comparator 112 asserts the comparator output signal which is coupled to counter 116. When the comparator output signal is asserted, counter 116 outputs the count value as the indexing parameter P11 to index look-up table 118 to retrieve the selected coefficient sets.

For example, assume that a first RXPWR value is less than the first delimiter DLM0. The first RXPWR value is provided to comparator 112 while the first delimiter DLM0 is also provided to comparator 112 and the counter has a count value of 1. Comparator 112 asserts its comparator output signal and counter 116 outputs the count value of 1 to index look-up table 118. The first set of coefficients. Coeff. Set 0 is thus retrieved.

Now, assume that a second RXPWR value is greater than the fourth delimiter DLM3 but less than the fifth delimiter DLM4. The second RXPWR value is provided to comparator 112 while the first to fifth delimiters DLM0-4 are also provided to comparator 112 in turn. Counter 116 has a count value of 5 by the time the fifth delimiter DLM4 is provided. Comparator 112 asserts its comparator output signal when it is determined that the second RXPWR value is less than or equal to the fifth delimiter DLM4. Counter 116 outputs the count value of 5 to index look-up table 118. The fifth set of coefficients. Coeff. Set 4 is thus retrieved.

The retrieved coefficient set is provided to ALU 108 to perform numerical value conversion of the RXPWR. ADC result. When the ADC result is not the RXPWR parameter but is digitized value of other data sources, data processing device 100 retrieves the coefficients from look-up table 120 for ALU 108 in the manner as described above and in reference to the '786 patent application. The coefficients provided by look-up table 118 and look-up table 120 are coupled to a multiplexor 107 which selects either coefficients for the received power RXPWR (lookup table 118) or coefficients for other data sources (lookup table 120). Control circuit 103 in optical transceiver controller 22 generates the select signal SEL2 to operate multiplexor 107 to select the appropriate coefficients for use by ALU 108 for performing numerical value conversion of the ADC result. When the received power parameter is being processed, multiplexor 107 selects the coefficients from lookup table 118. When other data sources are being processed, multiplexor 107 selects the coefficients from lookup table 120.

In the present illustration, the converted results from ALU 108 in natural units are typically stored in a memory 110, such as registers. Host processor 30 can then retrieve the data stored in memory 110 to obtain status and operating condition information about optical transceiver controller 22.

The use of variable range coefficients for numerical value conversion in accordance with the data processing device of present invention provides numerous advantages not realized by prior art systems. First, by partitioning the range of ADC results into unequal regions, the accuracy of numerical value conversion can be greatly improved. The size of each piecewise-linear partition and the total number of partitions can be optimized to accurately approximate the full range of digital input values.

Second, a fast and efficient data processing device is realized by using unequal partitions to better approximate the non-linear conversion. While it is possible to implement piecewise-linear conversion by providing many fine, equal sized partitions, such an implementation will create a large memory requirement and a heavy computation burden. The variable range coefficient method of the present invention optimizes accuracy with speed and simplicity of implementation.

Finally, by using a look-up table for coefficient storage, complex numerical value conversion can be performed with simple and minimum circuitry. As a result, an optimized coefficient storage mechanism is realized for efficient numerical value conversion.

The above detailed descriptions are provided to illustrate specific embodiments of the present invention and are not intended to be limiting. Numerous modifications and variations within the scope of the present invention are possible. For example, in FIG. 2, optical transceiver controller 22 includes a lookup table 118 for storing coefficients for the received power parameter and a lookup table 120 for storing coefficients for other data sources, such as the monitor voltage VMPD, the bias current VBIAS and temperature. Lookup table 120 is optional and is illustrative only. In other embodiments, the optical transceiver controller may operate only on a single parameter, such as the received power parameter. In that case, lookup table 120 is not needed and multiplexor 107 is also not needed. The output of lookup table 118 can be provided directly as input data values to ALU 108.

The present invention is defined by the appended claims.

I claim:

1. A device for processing an N-bit digital input value generated by an analog-to-digital converter and generating a digital output signal, the digital input value being in a first unit being an arbitrary unit and the digital output signal being in a second unit being a natural unit of physical measurement and being related to the first unit by a first equation, the digital output signal for use by a host processor to process information captured by the analog-to-digital converter, the device comprising:

a memory comprising a first memory portion and a second memory portion;

the first memory portion having stored thereon Q delimiter values, the Q delimiter values dividing the range of the N-bit digital input value into Q+1 regions, at least a first region and a second region in the Q+1 regions being of unequal sizes;

the second memory portion having stored thereon a look-up table storing Q+1 sets of coefficients for performing numerical value conversion of the digital input value in the first unit to the digital output value in the second unit, each set of coefficients comprising a coefficient pair of slope and offset coefficients and being associated with a respective one of the Q+1 regions of digital input values, the look-up table being indexed by a first indexing parameter to provide a selected coefficient pair of slope and offset coefficients, the first indexing parameter being selected to operate the device for non-linear conversion; and an arithmetic logic unit receiving the N-bit digital input value in the first unit and the selected coefficient pair of slope and offset coefficients from the look-up table in the second memory portion, the arithmetic logic unit performing numerical value conversion based on the first equation and computing the digital output value in the second unit using the N-bit digital input value and the selected coefficient pair, wherein the N-bit digital input value is compared with the Q delimiter values to determine a respective one of the Q+1 regions in which the N-bit digital input value lies and the first indexing parameter has a value indicative of the respective one of the Q+1 regions and being applied to the look-up table to provided the selected coefficient pair.

2. The device of claim 1, wherein the N-bit digital input value comprises a received power value of an optical transceiver.

3. The device of claim 1, further comprising:

a comparator receiving the N-bit digital input value and comparing the N-bit digital input value to at least one of the Q delimiter values, the Q delimiter values being provided to the comparator successively from the smallest delimiter value to the largest delimiter value, the comparator asserting a comparator output signal when the N-bit digital input value is less than a respective delimiter value; and a counter providing a counter output value, the counter output value incrementing each time a delimiter value is provided to the comparator until the counter output value is asserted, wherein the first indexing parameter comprises the counter output value where the counter output value corresponds to the Q+1 sets of coefficients stored in the look-up table.

4. The device of claim 3, wherein the comparator asserts the comparator output signal when the N-bit digital input value is less than or equal to a respective delimiter value.

5. The device of claim 3, wherein when the N-bit digital input value is larger than the largest delimiter value, the first indexing parameter selects the last set of coefficients, the last set of coefficients for performing numerical value conversion of the largest values in the range of N-bit digital input values.

6. The device of claim 1, further comprising:
a comparator receiving the N-bit digital input value and comparing the N-bit digital input value to at least one of the Q delimiter values, the Q delimiter values being provided to the comparator successively from the largest delimiter value to the smallest delimiter value, the comparator asserting a comparator output signal when the N-bit digital input value is greater than a respective delimiter value; and
a counter providing a counter output value, the counter output value incrementing each time a delimiter value is provided to the comparator until the counter output value is asserted, wherein the first indexing parameter comprises the counter output value where the counter output value corresponds to the Q+1 sets of coefficients stored in the look-up table.

7. The device of claim 6, wherein the comparator asserts the comparator output signal when the N-bit digital input value is greater than or equal to a respective delimiter value.

8. The device of claim 6, wherein when the N-bit digital input value is smaller than the smallest delimiter value, the first indexing parameter selects the first set of coefficients, the first set of coefficients for performing numerical value conversion of the smallest values in the range of N-bit digital input values.

9. The device of claim 1, wherein the numerical value conversion from the arbitrary unit to the natural unit has a non-linear relationship and the Q+1 sets of coefficients implements the numerical value conversion in a piecewise-linear fashion approximating the non-linear relationship.

10. The device of claim 9, wherein the look-up table stores the Q+1 sets of coefficients for a plurality of linear segments for performing the piecewise-linear numerical value conversion, each linear segment being described by the equation $D_N = m\,D_A + c$, where $D_A$ is the digital input value, $D_N$ is the digital output value, m is a slope coefficient and c is an offset coefficient for the respective linear segment, and the Q+1 sets of coefficients comprises Q+1 sets of coefficient pairs, each coefficient pair comprising a slope coefficient and an offset coefficient for the respective linear segment.

11. The device of claim 9, wherein the non-linear relationship comprises a logarithmic relationship.

12. The device of claim 1, wherein the first region has a first range of N-bit digital input values and the second region has a second range, larger than the first range, of N-bit digital input values, the digital input values in the second region being greater than the digital input values in the first region.

13. A method for processing an N-bit digital input value generated by an analog-to-digital converter and generating a digital output signal, the digital input value being in a first unit being an arbitrary unit and the digital output signal being in a second unit being a natural unit of physical measurement and being related to the first unit by a first equation, the digital output signal for use by a host processor to process information captured by the analog-to-digital converter, the method comprising:
storing Q delimiter values in a first memory portion of a memory, the Q delimiter values dividing the range of the N-bit digital input value into Q+1 regions, at least a first region and a second region in the Q+1 regions being of unequal sizes;
storing Q+1 sets of coefficients in a look-up table in a second memory portion of the memory for performing the numerical value conversion of the digital input value in the first unit to digital output value in the second unit, each set of coefficients comprising a coefficient pair of slope and offset coefficients and being associated with a respective one of the Q+1 regions of digital input values;
comparing the N-bit digital input value with the Q delimiter values to determine a respective one of the Q+1 regions in which the N-bit digital input value lies;
generating a first indexing parameter having a value indicative of the respective one of the Q+1 regions;
indexing the look-up table using the first indexing parameter to provide a selected coefficient pair of slope and offset coefficients, the first indexing parameter being selected to operate the device for non-linear conversion;
providing the N-bit digital input value and the selected coefficient pair of slope and offset coefficients to an arithmetic logic unit; and
performing numerical value conversion at the arithmetic logic unit based on the first equation and using the N-bit digital input value and the selected coefficient pair of slope and offset coefficients to compute a digital output value in the second unit from the digital input value in the first unit.

14. The method of claim 13, wherein the N-bit digital input value comprises a received power value of an optical transceiver.

15. The method of claim 13, wherein comparing the N-bit digital input value with the Q delimiter values to determine a respective one of the Q+1 regions in which the N-bit digital input value lies comprises:
providing the Q delimiter values successively from the smallest delimiter value to the largest delimiter value to be compared with the N-bit digital input value;
comparing the N-bit digital input value to at least one of the Q delimiter values;
asserting a comparison output signal when the N-bit digital input value is less than a respective delimiter value;
counting the number of delimiter values having been provided for comparison with the N-bit digital input value until the comparison output signal is asserted; and
generating a counter output value being the first indexing parameter where the counter output value corresponds to the Q+1 sets of coefficients stored in the look-up table.

16. The method of claim 15, further comprising:
when the N-bit digital input value is larger than the largest delimiter value, providing the first indexing parameter to select the last set of coefficients, the last set of coefficients for performing numerical value conversion of the largest values in the range of N-bit digital input values.

17. The method of claim 13, wherein comparing the N-bit digital input value with the Q delimiter values to determine a respective one of the Q+1 regions in which the N-bit digital input value lies comprises:
providing the Q delimiter values successively from the largest delimiter value to the smallest delimiter value to be compared with the N-bit digital input value;
comparing the N-bit digital input value to at least one of the Q delimiter values;
asserting a comparison output signal when the N-bit digital input value is greater than a respective delimiter value;

counting the number of delimiter values having been provided for comparison with the N-bit digital input value until the comparison output signal is asserted; and generating a counter output value being the first indexing parameter where the counter output value corresponds to the Q+1 sets of coefficients stored in the look-up table.

18. The method of claim 17, further comprising:

when the N-bit digital input value is smaller than the smallest delimiter value, providing the first indexing parameter to select the first set of coefficients, the first set of coefficients for performing numerical value conversion of the smallest values in the range of N-bit digital input values.

19. The method of claim 13, wherein storing Q+1 sets of coefficients in a look-up table in a second memory portion of the memory for performing the numerical value conversion of the digital input value in the first unit to digital output value in the second unit comprises:

storing Q+1 sets of coefficients in the look-up table wherein the numerical value conversion from the arbitrary unit to the natural unit has a non-linear relationship and the plurality of coefficients implements the numerical value conversion in a piecewise-linear fashion approximating the non-linear relationship.

20. The method of claim 19, wherein storing Q+1 sets of coefficients in a look-up table further comprises:

storing coefficients for a plurality of linear segments for performing the piecewise-linear numerical value conversion, each linear segment being described by the equation $D_N = m\, D_A + c$, where $D_A$ is the digital input value, $D_N$ is the digital output value, m is a slope coefficient and c is an offset coefficient for the respective linear segment, wherein the Q+1 sets of coefficients comprises a plurality of coefficient pairs, each coefficient pair comprising a slope coefficient and an offset coefficient for the respective linear segment.

21. The method of claim 13, wherein the first region has a first range of N-bit digital input values and the second region has a second range, larger than the first range, of N-bit digital input values, the digital input values in the second region being greater than the digital input values in the first region.

* * * * *